United States Patent
Teraoka et al.

(10) Patent No.: US 6,333,571 B1
(45) Date of Patent: *Dec. 25, 2001

(54) MOS INTEGRATED CIRCUIT DEVICE OPERATING WITH LOW POWER CONSUMPTION

(75) Inventors: Eiichi Teraoka; Toyohiko Yoshida, both of Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/577,969

(22) Filed: May 25, 2000

Related U.S. Application Data

(63) Continuation of application No. 09/084,949, filed on May 28, 1998, now Pat. No. 6,097,113.

(30) Foreign Application Priority Data

Oct. 14, 1997 (JP) .................................................... 9-280388

(51) Int. Cl.[7] ................................................... H01H 47/00
(52) U.S. Cl. ........................... 307/125; 307/115; 327/534; 327/537; 327/544
(58) Field of Search .................................... 307/125, 115; 327/534, 537, 544

(56) References Cited

U.S. PATENT DOCUMENTS 5,917,365    4/1997    Houston .

FOREIGN PATENT DOCUMENTS

| 55-87470 | 7/1980 | (JP) . |
| 57-122574 | 7/1982 | (JP) . |
| 2-20062 | 1/1990 | (JP) . |
| 5-108175 | 4/1993 | (JP) . |
| 6-21443 | 1/1994 | (JP) . |
| 6-291267 | 10/1994 | (JP) . |

*Primary Examiner*—Josie Ballato
*Assistant Examiner*—Robert L. Deberadinis
(74) *Attorney, Agent, or Firm*—McDermott, Will & Emery

(57) ABSTRACT

In accordance with selection signals corresponding to an operation mode from a mode detection circuit, the voltage levels of back gate voltages applied to the back gates of MOS transistors included in internal circuitry are selected, by the selection signals, among the voltages from voltage generation circuits for generating a plurality of voltages having different voltage levels. The threshold voltage and the drive current of the MOS transistor are adjusted in accordance with the operation mode, and the semiconductor integrated circuit device which operates at high speed with low current consumption can be achieved.

7 Claims, 10 Drawing Sheets

|Vth|: SMALL

|Vth|: MEDIUM

|Vth|: LARGE

MOS INTEGRATED CIRCUIT DEVICE OPERATING WITH LOW POWER CONSUMPTION

This application is a Continuation of application Ser. No. 09/084,949 filed May 28, 1998, now U.S. Pat. No. 6,097,113.

BACKGROUND OF THE INVENTION

1. Field of the Invention

The present invention relates to a semiconductor integrated circuit device which includes an MOS transistor (insulated gate type field effect transistor) as a component. More particularly, the present invention relates to a structure for achieving the low power consumption and high speed operation of an MOS semiconductor integrated circuit device which can operate in a plurality of operation modes.

2. Description of the Background Art

FIG. 19 shows an example of the structure of a conventional semiconductor integrated circuit device disclosed in Japanese Patent Laying-Open No. 6-291267, for example.

In FIG. 19, the conventional semiconductor integrated circuit device includes CMOS inverters IVa, IVb, IVc and IVd of four stages cascaded between an input node 101 and an output node 102. Each of CMOS inverters IVa–IVd operates using a power supply voltage VDD applied on a power supply node and a ground voltage GND applied on a ground node as one and another operational power supply voltages. Each of the inverters inverts an applied signal for output.

CMOS inverters IVa–IVd include respective P channel MOS transistors Pa–Pd for outputting an H level signal and respective N channel MOS transistors Na–Nd for outputting an L level signal.

The semiconductor integrated circuit device further includes a first voltage generation circuit 110a commonly connected to the substrate regions (back gates) of P channel MOS transistors Pa–Pd and outputting a back gate voltage Vps in accordance with a control signal from a control circuit 112a, and a second voltage generation circuit 110b commonly connected to the substrate regions (back gates) of N channel MOS transistors Na–Nd and outputting a back gate voltage Vns in accordance with a control signal from a control circuit 112b. The operation will briefly be described below.

Now, consider the case in which output voltage Vps from first voltage generation circuit 110a is set to a voltage level which is slightly lower than power supply voltage VDD in accordance with the control signal from control circuit 112a, and output voltage Vns from second voltage generation circuit 110b is set to a voltage level which is slightly higher than ground voltage GND in accordance with the control signal from control circuit 112b.

In this case, when an input signal applied to input node 101 makes a transition from an L level to an H level, an output signal applied to output node 102 through CMOS inverters IVa–IVd of four stages makes a transition from the L level to the H level. When back gate voltage Vps of P channel MOS transistors Pa–Pd is lower than power supply voltage VDD, depletion layers in the channel formation regions of P channel MOS transistors Pa–Pd are widened. In N channel MOS transistors Na–Nd as well, when back gate voltage Vns is higher than ground voltage GND, depletion layers are wider than when ground voltage GND is applied to the back gates. Therefore, when P channel MOS transistors Pa–Pd and N channel MOS transistors Na–Nd are switched on and rendered conductive to form the channels, the widened depletion layers increase the channel sectional areas and the amount of moving carriers. Accordingly, MOS transistors Pa–Pd and Na–Nd are switched on and off at high speed, and the amount of drive current and the response speed are increased.

Even when the input signal applied to input node 101 makes a transition from the H level to the L level, MOS transistors Pa–Pd and Na–Nd are operated at high speed due to back gate voltages Vps and Vns, and the signal of output node 102 makes a transition from the H level to the L level.

Now, consider the case in which back gate voltage Vps from first voltage generation circuit 110a is set to a voltage level higher than power supply voltage VDD in accordance with the control signal from control circuit 112a, and back gate voltage Vns from second voltage generation circuit 110b is set to a voltage level lower than ground voltage GND in accordance with the control signal from control circuit 112b.

In this case, the depletion layers of MOS transistors Pa–Pd and Na–Nd become narrower than when power supply voltage VDD and ground voltage GND are applied as the back gate voltages, and channel formation is suppressed. In this case, when the signal applied to input node 101 makes a transition from the L level to the H level, CMOS inverters IVa–IVd cause the output signal at output node 102 to make a transition from the L level to the H level. However, since the depletion layers are narrower and the channel sectional areas are accordingly smaller, the amount of moving carriers, the amount of current and the response speed are reduced.

Therefore, by adjusting the voltage levels of back gate voltages Vps and Vns output from voltage generation circuits 110a and 110b, the amount of drive current and the response speed of a semiconductor circuit can be adjusted depending on applications.

In order to reduce the response time to allow the high speed operation in the semiconductor integrated circuit device shown in FIG. 19, voltage Vps applied to the back gates of P channel MOS transistors Pa–Pd is set to the voltage level of Vps1 slightly lower than power supply voltage VDD, and voltage Vns applied to the back gates of N channel MOS transistors Na–Nd is set to the voltage level of Vns1 slightly higher than ground voltage GND, as shown in FIG. 20. Thus, the back gate biases of MOS transistors Pa–Pd and Na–Nd are made slightly shallower and the depletion layers formed immediately under the channels are slightly widened. On the other hand, for the low speed operation, back gate voltage Vps is set to the voltage level of Vps2 slightly higher than power supply voltage VDD, and back gate voltage Vns of N channel MOS transistors Na–Nd is set to a voltage level slightly lower than ground voltage GND. Thus, the back gate biases of MOS transistors Pa–Pd and Na–Nd are made deeper, the depletion layers are made narrower, and the amount of drive current is reduced.

Back gate voltages Vps and Vns each determine the threshold voltage of an MOS transistor, and the threshold voltages of MOS transistors Pa–Pd and Na–Nd are changed according to the values of back gate voltages Vps and Vns. On the other hand, a current called a subthreshold leakage current is known in an MOS transistor.

FIG. 21 shows the relationship between a gate-to-source voltage Vgs and a drain current Ids in the subthreshold region of an N channel MOS transistor. In FIG. 21, the ordinate indicates drain current Ids in a logarithm scale and the abscissa indicates gate-to-source voltage Vgs. The threshold voltage of an MOS transistor is defined as a gate-to-source voltage causing a prescribed drain current to flow in an MOS transistor having a predetermined gate width. In FIG. 21, a curve I indicates gate-to-source voltage Vgs and drain current Ids when the threshold voltage is Vth1, while a curve II indicates the relationship between drain current Ids and gate-to-source voltage Vgs of an MOS transistor having a threshold voltage Vth2. A region in which curves I and II change linearly is where drain current Ids decreases exponentially, and it is called a subthreshold region.

As shown in FIG. 21, a current of a certain magnitude flows in an MOS transistor even if gate-to-source voltage Vgs is 0V. Usually, this current is called a subthreshold leakage current. As the threshold voltage increases, the subthreshold leakage current decreases. However, the operation speed of an MOS transistor is lowered as the threshold voltage increases. If the back gate bias is made deeper (shifted in a negative direction) in an N channel MOS transistor, the threshold voltage is increased and the characteristic curve changes from curve I to curve II as shown in FIG. 21. The relationship between the drain current and the gate-to-source voltage of a P channel MOS transistor is obtained by inverting the sign of gate-to-source voltage Vgs of the graph shown in FIG. 21.

Therefore, as shown in FIGS. 20 and 21, when the back gate bias is made deeper and back gate voltages Vns2 and Vps2 are applied in the semiconductor integrated circuit device shown in FIG. 19, the threshold voltage becomes higher than when back gate biases Vns1 and Vps1 are applied, and the subthreshold leakage current decreases. In this case, however, back gate voltages Vns and Vps only have their voltage levels shifted from ground voltage GND and power supply voltage VDD, and the subthreshold leakage current cannot sufficiently be reduced. Especially, when a battery is used as a power supply as in the case of portable information terminal equipments, the value of the subthreshold leakage current in a standby cycle or a low speed operation cannot be ignored, and the battery life cannot be improved.

The prior art document (Japanese Patent Laying-Open No. 6-291267) which discloses the semiconductor integrated circuit device shown in FIG. 19 only describes adjustment of the response speed and the drive current amount according to its operational environment. In other words, it only considers the operation speed in the operation cycle of the semiconductor integrated circuit device and does not consider at all the problems associated with the subthreshold leakage current in the standby cycle or the low speed operation.

A structure for reducing the leakage current in-the standby cycle as described above is disclosed in, for example, Japanese Patent Laying-Open No. 6-21443. In this prior art, to the back gate of an N channel MOS transistor, a positive voltage Vp is applied in an active cycle (operation cycle) and ground voltage GND is applied in the standby cycle. FIG. 22 shows the relationship between the back gate voltage and the threshold voltage of the prior art N channel MOS transistor.

Now, consider the case in which the threshold voltage Vth of an N channel MOS transistor when a back gate-to-source voltage VBS (voltage measured relatively to the source voltage (ground voltage)) is a voltage Vb is 0.1V, and threshold voltage Vth when back gate-to-source voltage VBS is 0V is 0.4V as shown in FIG. 22. Since voltage Vb cannot exceed the built-in voltage (diffusion potential) Vpn (~1V) of a PN junction in this case, voltage Vb is smaller than voltage Vpn. Therefore, in order to satisfy a threshold voltage condition required for using voltage Vb, a characteristic curve having a considerably steep slope as shown in FIG. 22 should be realized. Since the slope of this characteristic curve is proportional to a substrate effect constant K, this substrate effect constant K should be larger. Substrate effect constant K is usually proportional to a product of the square root of substrate impurity concentration and the film thickness of a gate insulation film. Therefore, the impurity concentration of a substrate region (back gate region) needs to be higher to increase substrate effect constant K. In this case, the depletion layer is made narrower and the gate capacitance is accordingly increased, thus the high speed operation is not allowed (voltage Vb is a voltage which is applied for the high speed operation and its purpose cannot be achieved).

When the width of the depletion layer is narrower, since the electric field strength in the PN junction is inversely proportional to the width of the depletion layer, the electric field strength of the PN junction is increased, a junction break-down voltage is lowered, and the reliability of an element is deteriorated. When the impurity concentration of the substrate region is made higher, a diffusion current is caused in proportion to a difference between the impurity concentration of a substrate region and the impurity concentration of source/drain impurity regions of N channel MOS transistor. Accordingly, a reverse current (current which flows when a reverse bias voltage is applied to a PN junction), a leakage current and therefore current consumption are increased.

In the case of the characteristic curve shown in FIG. 22, threshold voltage Vth changes to a greater extent only with a slight change of back gate-to-source voltage VBS, thus making it difficult to accurately set a desired threshold voltage.

SUMMARY OF THE INVENTION

An object of the present invention is to provide a semiconductor integrated circuit device which allows reduction of current consumption, especially, a leakage current without sacrificing the performance and the reliability of an element.

A semiconductor integrated circuit device according to the present invention includes: internal circuitry including, as a component, an MOS transistor having a source receiving a prescribed voltage and a back gate, and operatable in a plurality of operation modes; a bias voltage generation circuit generating voltages which have different voltage levels from each other and different polarities from each other with respect to the source voltage of the MOS transistor and generating a voltage which has the same voltage level as the source voltage; an operation mode detection circuit detecting an operation mode of the internal circuitry and generating a selection signal which corresponds to the detected operation mode; and a bias voltage selection circuit receiving the selection signal from the operation mode detection circuit and a plurality of bias voltages from the bias voltage generation circuit, selecting one of the plurality of bias voltages in accordance with the received selection signal, and applying it to the back gate of the MOS transistor.

By generating the source voltage of the MOS transistor and bias voltages which have different polarities with respect to the source voltage, selecting one of a plurality of bias voltages according to the operation mode, and applying the selected voltage to the back gate of the MOS transistor, the MOS transistor can be operated at optimum speed according to the operation mode. Since an optimum back gate voltage is selected according to the operation mode, unnecessary current such as a subthreshold leakage current and therefore current consumption can be reduced. Further, by generating bias voltages which have different polarities with respect to the source voltage, and utilizing these voltages, application of an unnecessary high voltage between the back gate and the gate electrode of the MOS transistor can be prevented. Therefore, the reliability of a gate insulation film is ensured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
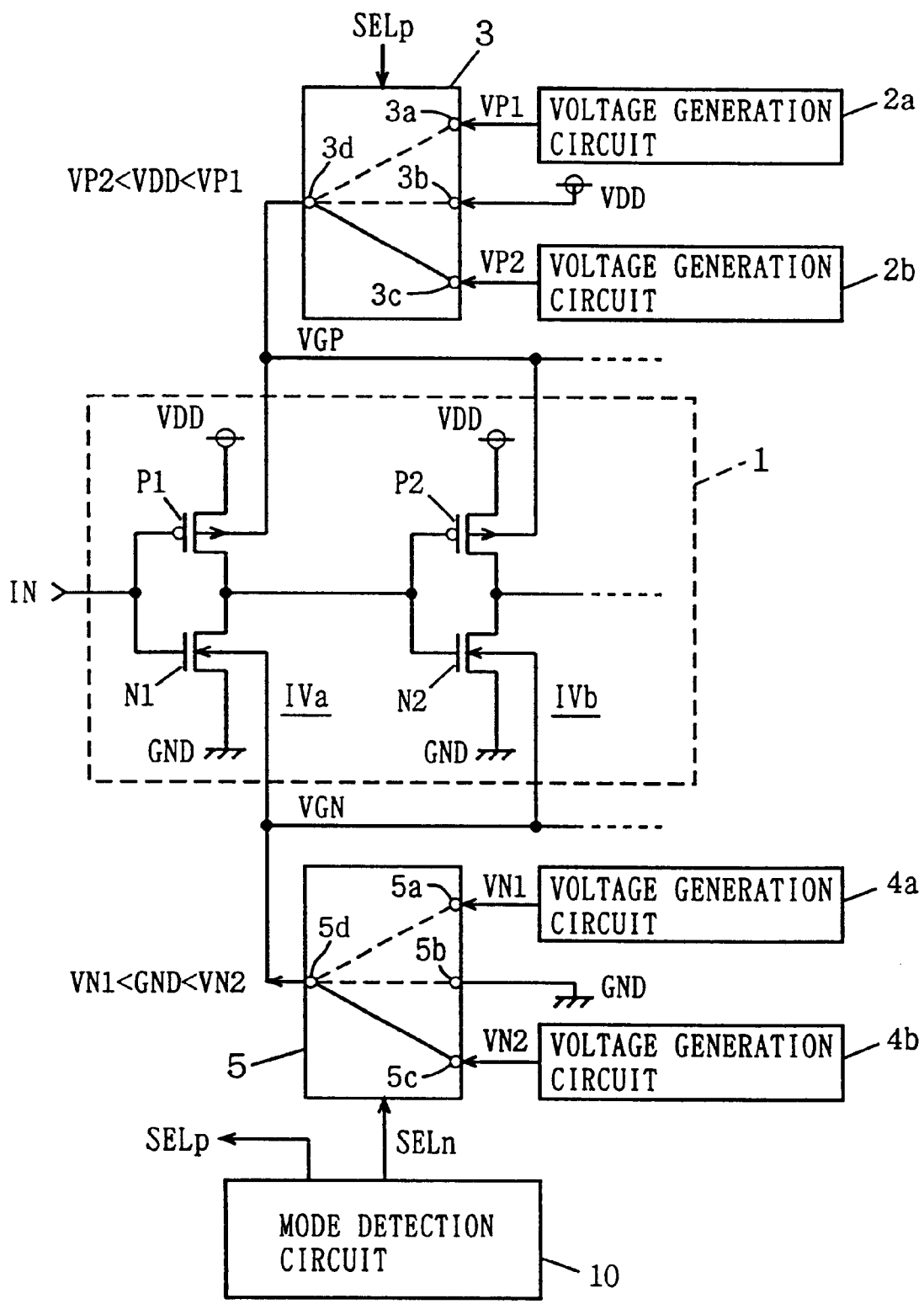
FIG. 1 schematically shows an overall structure of a semiconductor integrated circuit device according to a first embodiment of the present invention.

FIG. 1 schematically shows an overall structure of a semiconductor integrated circuit device according to a first embodiment of the present invention. In FIG. 1, the semiconductor integrated circuit device includes internal circuitry 1 which carries out a prescribed processing on an input signal IN. In internal circuitry 1, cascaded CMOS inverters IVa and IVb of two stages are representatively shown. CMOS inverter IVa includes a P channel MOS transistor P1 and an N channel MOS transistor N1 which are connected between a power supply node VDD supplying a power supply voltage VDD (a node and a voltage thereat are denoted by the same character) and a ground node supplying a ground voltage GND. CMOS inverter IVb includes a P channel MOS transistor P2 and an N channel MOS transistor N2 which are connected between power supply node VDD and ground node GND and which receive an output signal from inverter IVa at their gates.

The semiconductor integrated circuit device further includes a voltage generation circuit 2a generating, when activated, a voltage VP1 higher than power supply voltage VDD, a voltage generation circuit 2b generating, when activated, a voltage VP2 lower than power supply voltage VDD, and a selection circuit 3 receiving voltage VP1 from voltage generation circuit 2a, power supply voltage VDD and voltage VP2 from voltage generation circuit 2b at input nodes 3a, 3b and 3c, and selecting one of the voltages applied to input nodes 3a–3c and transferring the selected voltage to an output node 3d in accordance with a selection signal SELp from a mode detection circuit 10 which detects the operation mode of internal circuitry 1. An output voltage VGP from output node 3d of selection circuit 3 is applied to the back gates of P channel MOS transistors P1, P2 . . . included in internal circuitry 1.

The semiconductor integrated circuit device further includes a voltage generation circuit 4a generating, when activated, a negative voltage VN1 lower than ground voltage GND, a voltage generation circuit 4b generating, when activated, a positive voltage VN2 higher than ground voltage GND, and a selection circuit 5 receiving voltage VN1 from voltage generation circuit 4a, ground voltage GND and voltage VN2 from voltage generation circuit 4b at input nodes 5a, 5b and 5c, and transferring a voltage applied to one of input nodes 5a–5c to an output node 5d in accordance with a selection signal SELn from mode detection circuit 10. An output voltage VGN from selection circuit 5 is applied to the back gates of N channel MOS transistors N1, N2, ... included in internal circuitry 1.

P channel MOS transistors P1, P2, ... included in internal circuitry 1 have their sources coupled to a power supply node, and N channel MOS transistors N1, N2, have their sources coupled to a ground node. Therefore, voltage generation circuits 2a and 2b generate voltages VP1 and VP2 which have different polarities from each other with respect to source voltage VDD of P channel MOS transistors P1, P2.

Voltage VP2 is set to such a voltage level that will not forwardly bias the PN junction between the substrate and the source of each of P channel MOS transistors P1 and P2. Similarly, voltages VN1 and VN2 generated by voltage generation circuits 4a and 4b have different polarities from each other with respect to the source voltage of N channel MOS transistors N1 and N2 included in internal circuitry 1. Positive voltage VN2 generated by voltage generation circuit 4b is set to such a voltage level that will not forwardly bias the PN junction between the substrate region (back gate) and the source/drain of an N channel MOS transistor. The voltage levels of voltages VP2 and VN2 will be described below.

Figure 2A:
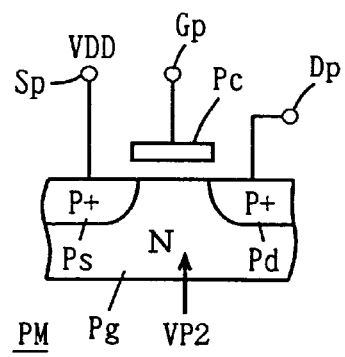
FIG. 2A shows a schematic sectional structure of a P channel MOS transistor shown in FIG. 1 and a back gate voltage.

FIG. 2A schematically shows a sectional structure of a P channel MOS transistor P(P1, P2) shown in FIG. 1. In FIG. 2A, P channel MOS transistor PM includes P type impurity regions Ps and Pd of high concentration formed spaced apart at the surface of an N type substrate region (well or substrate) Pg, and a gate electrode layer Pc formed on substrate region Pg between impurity regions Ps and Pd with a gate insulation film, not shown, interposed between the gate electrode layer and the substrate region. Impurity region Ps is electrically connected to a source node Sp to receive power supply voltage VDD. Impurity region Pd is electrically connected to a drain node Dp. Gate electrode layer Pc is electrically connected to a gate electrode node Gp.

In the P channel MOS transistor PM, substrate region Pg serves as a back gate, and is supplied with voltage VGP from selection circuit 3 shown in FIG. 1. Now, consider the case in which voltage VP2 lower than power supply voltage VDD is applied as back gate voltage VGP. In this case, impurity region Ps receives power supply voltage VDD, and impurity region Pd is also at a power supply voltage VDD level when a voltage applied to gate electrode node Gp is at the L level. Therefore, when the PN junctions between each of impurity regions Ps and Pd and substrate region (back gate) Pg are forwardly biased, current flows from impurity regions Ps and Pd to substrate region (back gate) Pg, which increases current consumption and causes a malfunction. Therefore, back gate voltage VP2 needs to be set to a voltage level which is not higher than a built-in voltage Vpn formed by the PN junctions between substrate region Pg and each of impurity regions Ps and Pd. Accordingly, the following relation is satisfied.

0<VDD−VP2<Vpn

VDD−Vpn<VP2<VDD

Figure 2B:
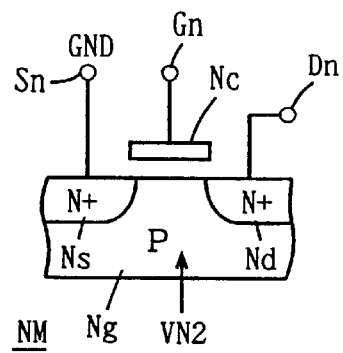
FIG. 2B shows a schematic sectional structure of an N channel MOS transistor shown in FIG. 1 and a back gate voltage.

FIG. 2B schematically shows a sectional structure of an N channel MOS transistor NM (N1, N2) shown in FIG. 1. In FIG. 2B, N channel MOS transistor NM includes N type impurity regions Ns and Nd of high concentration formed spaced apart at the surface of a P type substrate region (back gate) Ng, and a gate electrode layer Nc formed on substrate region Ng between impurity regions Ns and Nd with a gate insulation film, not shown, interposed between the gate electrode layer and the substrate region. Impurity region Ns is electrically connected to a source node Sn, impurity region Nd is electrically connected to a drain node Dn, and gate electrode layer Nc is electrically connected to a gate electrode node Gn.

Impurity region Ns receives ground voltage GND. Impurity region Nd changes in voltage between ground voltage GND and power supply voltage VDD. Substrate region (back gate) Ng is supplied with back gate voltage VGN from selection circuit 5 shown in FIG. 1.

Now, consider the case in which back gate voltage VGN is positive voltage VN2. In this case as well, when PN junctions between substrate region Ng and each of impurity regions Ns and Nd are forwardly biased, current flows from substrate region (back gate) Ng to impurity regions Ns and Nd, which increases current consumption and causes a malfunction. Therefore, the PN junctions between substrate region (back gate) Ng and each of impurity regions Ns and Nd need to be kept non-conductive in this case as well. Therefore, positive voltage VN2 satisfies the following relation.

GND+Vpn>VN2

In other words, positive voltage VN2 is set to a voltage level which is lower than a diffusion potential generated at the PN junctions between substrate region Ng and each of impurity regions Ns and Nd, that is, built-in voltage Vpn. The operation of the semiconductor integrated circuit device shown in FIG. 1 will be described below.

When the semiconductor integrated circuit device is operated at high speed, mode detection circuit 10 generates selection signals SELp and SELn which designate a high speed operation mode. In accordance with selection signal SELp which designates the high speed operation mode, selection circuit 3 selects voltage VP2 applied to input node 3c from voltage generation circuit 2b, and applies selected voltage VP2 as back gate voltage VGP to the back gates of P channel MOS transistors P1, P2, ... of internal circuitry 1. Similarly, in accordance with selection signal SELn from mode detection circuit 10, selection circuit 5 selects voltage VN2 applied to input node 5c from voltage generation circuit 4b and generates back gate voltage VGN for N channel MOS transistors N1, N2 ... included in internal circuitry 1.

Figure 3A:
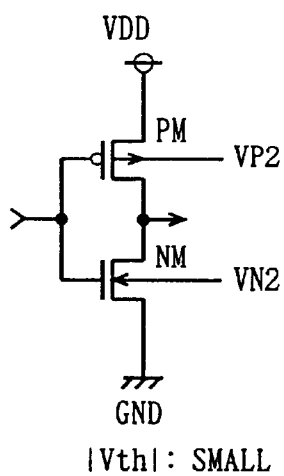
FIG. 3A shows a back gate voltage when internal circuitry shown in FIG. 1 is in a high speed operation mode.

In this state, as shown in FIG. 3A, P channel MOS transistor PM (P1, P2, ... ) in internal circuitry 1 receives, as back gate voltage VGP, voltage VP2 lower than power supply voltage VDD, while N channel MOS transistor NM (N1, N2, ... ) receives, as back gate voltage VGN, voltage VN2 higher than ground voltage GND. In this state, the absolute values of threshold voltages Vth of P channel MOS transistor PM and N channel MOS transistor NM become smaller, and they are switched to an on/off state at high speed.

The depletion layer formed immediately under the channel is widened and the path through which current flows is enlarged to increase the drive current amount. Accordingly, P channel MOS transistor PM (P1, P2 ... ) and N channel MOS transistor NM (N1, N2 ... ) included in internal circuitry 1 perform a switching operation at high speed, thus realizing the high speed operation.

Since the off state period of MOS transistors PM and NM is short during the high speed switching operation, the subthreshold current in this period is extremely small as compared with an operating current which flows at the time of switching, and it can almost be ignored.

When the semiconductor integrated circuit device is operated at medium speed, mode detection circuit 10 detects a medium speed mode, and outputs selection signals SELp and SELn which correspond to the medium speed operation mode. Selection circuit 3 selects power supply voltage VDD applied to input node 3b and outputs it as back gate voltage VGP for P channel MbS transistors P1, P2, while selection circuit 5 outputs ground voltage GND applied to input node 5b as back gate voltage VGN for N channel MOS transistors N1, N2, . . .

Figure 3B:
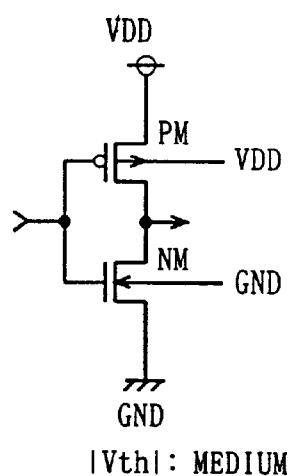
FIG. 3B shows a back gate voltage in a medium speed mode.

In this state, as shown in FIG. 3B, the back gate of P channel MOS transistor PM is supplied with power supply voltage VDD, and the back gate of N channel MOS transistor NM is supplied with ground voltage GND. Therefore, the absolute values of threshold voltages Vth of MOS transistors PM and NM are larger than those in the high speed mode. Therefore, the on/off timing of MOS transistors PM and NM which are components of the internal circuitry shown in FIG. 1 are slightly delayed as compared with the high speed operation, and the drive current amount is also smaller. Accordingly, inverters IVa and IVb included in internal circuitry 1 operate at medium speed.

In the medium speed mode as well, the subthreshold leakage current is caused when MOS transistors PM and NM are turned off after the completion of the switching operation. In this case, however, the operating current which flows at the time of the switching operation of MOS transistors PM and NM is sufficiently larger than the subthreshold leakage current and smaller than the operating current in the high speed mode. Therefore, the influence of the subthreshold leakage current can be ignored.

When the semiconductor integrated circuit device is operated in a low speed mode, mode detection circuit 10 outputs selection signals SELp and SELn which designate (correspond to) the low speed operation mode upon designation of the low speed mode. In accordance with selection signal SELp, selection circuit 3 selects voltage VP1 applied from voltage generation circuit 2a to input node 3a, and outputs it as back gate voltage VGP for the P channel MOS transistor. Further, selection circuit 5 selects voltage VN1 applied from voltage generation circuit 4a to input node 5a, and outputs it as back gate voltage VGN for the N channel MOS transistor.

Figure 3C:
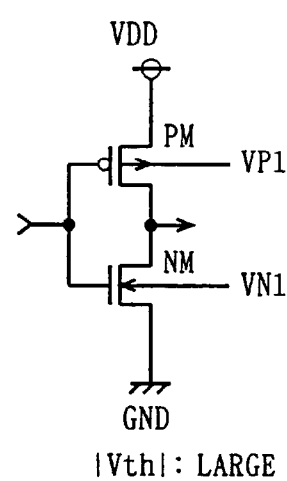
FIG. 3C shows application of a back gate voltage in a low speed mode.

In this case, as shown in FIG. 3C, the back gates of MOS transistors PM and NM are supplied with voltages VP1 and VN1, respectively, and the back gate biases of MOS transistors PM and NN become deeper than when power supply voltage VDD and ground voltage GND shown in FIG. 3B are applied. In this case, the on/off timing of MOS transistors PM and NM is delayed, the depletion layer becomes narrower, and the drive current amount is reduced. Accordingly, the switching speed of MOS transistors PM and NM is lowered. In this case, therefore, the switching speed of MOS transistor PM (P1, P2 . . . ) and MOS transistor NM (N1, N2 . . . ) is lowered, and internal circuitry 1 operates at low speed. Here, the absolute value of threshold voltage Vth has became larger and the subthreshold current of MOS transistors PM and NM is limited. Therefore, the leakage current can be reduced inspite of the low speed operation. Here, the low speed operation mode may be a state in which internal circuitry 1 is in a standby mode. In this standby state, the voltage level of input signal IN (see FIG. 1) is fixed to the H or L level. In this state, one of MOS transistors PM an NM is at the off state, and the subthreshold leakage current flows. However, since the back gate bias is at the deepest state, the leakage current can sufficiently be reduced. Low current consumption can be achieved by reducing the leakage current in the standby cycle.

Figure 4A:
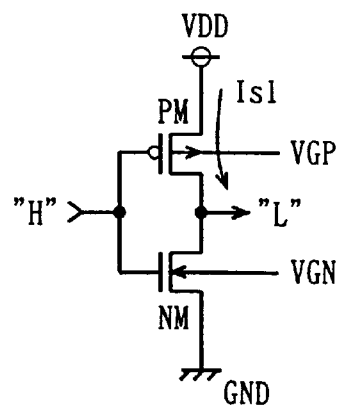
FIG. 4A schematically shows a path of a subthreshold leakage current of the internal circuitry shown in FIG. 1, and FIG. 4B schematically shows the relationship between current consumption and an input signal of the internal circuitry shown in FIG. 1.

FIG. 4A shows a state when an H level signal is input in the first stage inverter of internal circuitry shown in FIG. 1. In FIG. 4A, the H level ("H") signal is applied. In this state, the output signal is at the L level ("L"). After N channel MOS transistor NM discharges its output node to the ground voltage GND or L level, the voltages at its source and drain are equalized, and MOS transistor NM does not cause a current flow. On the other hand, P channel MOS transistor PM has its source voltage at the power supply voltage VDD level, its drain voltage at the L level, and its gate voltage at the H level. In this state, a subthreshold leakage current Isl flows. The magnitude of subthreshold leakage current Isl is determined by the magnitude of voltage VGP applied to the back gate of P channel MOS transistor PM.

Figure 4B:
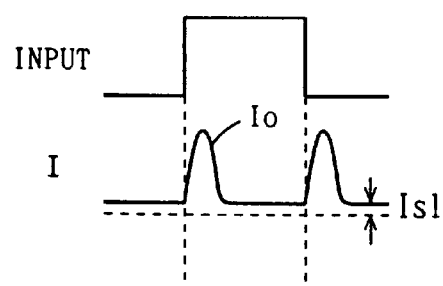

The state shown in FIG. 4A is a steady state after a CMOS inverter completes the switching operation. As shown in FIG. 4B, a large charging and discharging current flows when the input signal changes from the L level to the H level and from the H level to the L level. When the state of MOS transistors PM and NM is stabilized, subthreshold leakage current Isl flows. During the high speed operation, the transition cycle (pulse width) of this input signal is sufficiently short. The period when subthreshold leakage current Isl is caused is short, and the magnitude of the leakage current is smaller than current Io which flows at the time of switching of MOS transistors PM and NM and can almost be ignored. During the medium speed operation mode, the period when the MOS transistor is off is longer than in the high speed operation mode, and the time period when the subthreshold leakage current flows is accordingly longer. However, in the medium operation mode as well, the input signal changes comparatively at high speed. Therefore, the average value (DC current) of operation current Io which flows at the time of switching of MOS transistors PM and NM is sufficiently larger than the subthreshold leakage current, and the subthreshold leakage current can be ignored as compared with the operating current.

In the low speed operation mode (including the standby mode), the transition cycle of the input signal is longer and the period when the subthreshold leakage current flows is accordingly longer. In this case, however, the voltage levels of back gate voltages VGP and VGN of MOS transistors PM and NM are set so that the biases are deepest. Accordingly, the absolute values of threshold voltages of MOS transistors PM and NM are larger and the subthreshold leakage current is sufficiently suppressed. Therefore, the subthreshold leakage current is sufficiently suppressed and the peak current (maximum value of current Io) at the time of operation can be reduced during the low speed operation.

Figure 5:
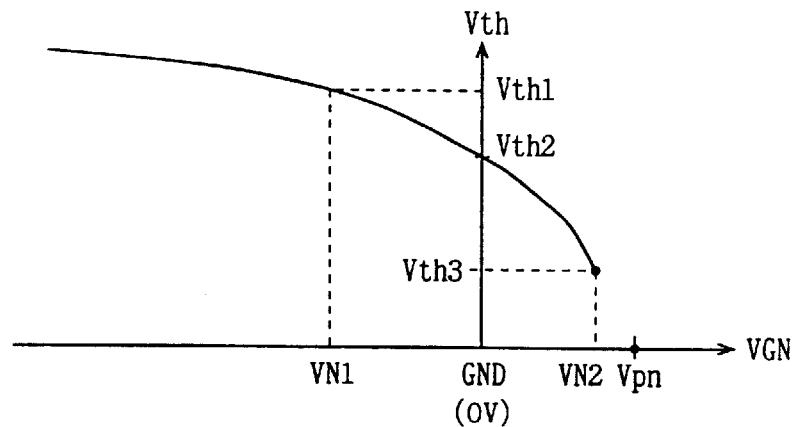
FIG. 5 schematically shows the relationship between a back gate voltage generated by a voltage generation circuit shown in FIG. 1 and a threshold voltage.

FIG. 5 shows the relationship between back gate voltage VGN and threshold voltage Vth of an N channel MOS transistor. As shown in FIG. 5 as back gate voltage VGN of the N channel MOS transistor, ground voltage GND which is its source voltage as well as voltages VN1 and VN2 which have different polarities from each other with respect to the source voltage GND are used according to the operation mode. Threshold voltage Vth increases in proportion to the square root of the absolute value of back gate voltage VGN. Therefore, in a region in which back gate voltage VGN is close to ground voltage GND, threshold voltage Vth changes to a greater extent than in other regions in accordance with back gate voltage VGN. Therefore, the values of threshold voltage Vth1 when voltage VN1 is applied as back gate voltage VGN, threshold voltage Vth2 when ground voltage GND is applied as back gate voltage VGN, and threshold voltage Vth3 when voltage VN2 is applied as back gate voltage VGN can sufficiently be differentiated from each other in a relatively small range of back gate voltages. The switching speed of the N channel MOS transistor can be adjusted according to the operation mode.

Since threshold voltage Vth can sufficiently be changed in accordance with back gate voltage VGN without increasing the impurity concentration of the substrate region (back gate), the absolute value of back gate voltage VN1 used in the low speed operation or standby modes can be made comparatively small. Thus, necessary threshold voltage Vthl can be achieved with the back gate bias voltage which is shallower than the substrate bias voltage conventionally used in a memory device, for example. In addition, application of a large voltage between the gate electrode and the substrate of an N channel MOS transistor can be prevented, and the reliability of a gate insulation film of an N channel MOS transistor can be ensured.

When threshold voltage Vth1 is, for example, 0.4V and threshold voltage Vth3 is, for example, 0.1V, an N channel MOS transistor having threshold voltage Vth2 of approximately 0.25V can easily be realized. Thus, a semiconductor integrated circuit device can be achieved which allows sufficient control of the operation speed and the subthreshold leakage current without affecting the reliability of the gate insulation film of an N channel MOS transistor.

FIG. 5 shows the relationship between threshold voltage Vth and back gate voltage VGN of an N channel MOS transistor. However, the relationship of threshold voltage Vth with back gate voltage VGP for a P channel MOS transistor can be obtained by changing ground voltage GND of FIG. 5 to power supply voltage VDD and inverting the sign of back gate voltage VGN.

FIG. 1 illustrates cascaded CMOS inverters of two stages as internal circuitry 1 of a semiconductor integrated circuit device. However, internal circuitry 1 may be any circuit which performs a desired signal process, and internal circuitry 1 may be formed of other logic gates as long as an MOS transistor is its component.

Structure of Each Portion

Figure 6:
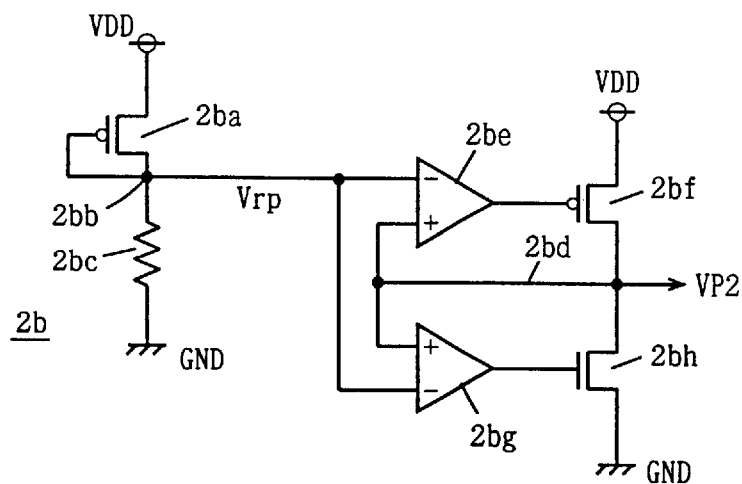
FIG. 6 shows an example of the structure of a circuit generating a back gate voltage VP2 shown in FIG. 1.

FIG. 6 shows an example of the structure of voltage generation circuit 2b which generates voltage VP2 shown in FIG. 1. In FIG. 6, voltage generation circuit 2b includes a P channel MOS transistor 2b a connected between power supply node VDD and an internal node 2bb and having its gate connected to internal node 2bb, a resistive element 2bc of high resistance connected between internal node 2bb and ground node GND, a differential amplifier 2be comparing a voltage Vrp at internal node 2bb and voltage VP2 at a node 2bd, a P channel MOS transistor 2bf supplying current from power supply node VDD to node 2bd in accordance with an output signal from differential amplifier 2be, a differential amplifier 2bg comparing voltage Vrp and voltage VP2, and an N channel MOS transistor 2bh connected between node 2bd and ground node GND and having its gate receiving an output signal from differential amplifier 2bg.

Differential amplifier 2be receives voltage Vrp at its negative input and voltage VP2 at its positive input. Differential amplifier 2bg receives voltage VP2 at its positive input and voltage Vrp at its negative input.

The channel resistance (on resistance) of P channel MOS transistor 2ba is set to a value sufficiently smaller than the resistance value of high resistance resistive element 2bc. Thus, P channel MOS transistor 2ba operates in a diode mode and causes a voltage drop of the absolute value of threshold voltage Vthp. Therefore, voltage Vrp from node 2bb is at the voltage level of VDD−|Vthp|.

When voltage VP2 is higher than voltage Vrp, the output signal from differential amplifier 2be attains the H level and P channel MOS transistor 2bf is turned off. On the other hand, the output signal from differential amplifier 2bg also attains the H level and N channel MOS transistor 2bh is turned on. As a result, current is discharged from node 2bd to ground node GND and the voltage level of voltage VP2 is lowered. When voltage VP2 is lower than voltage Vrp, the output signal from differential amplifier 2be attains the L level and P channel MOS transistor 2bf is rendered conductive. As a result, current is supplied from power supply node VDD to node 2bd and the voltage level of voltage VP2 is raised. At this time, the output signal from differential amplifier 2bg is at the L level and N channel MOS transistor 2bh is off. Therefore, voltage VP2 is kept at the voltage level of approximately voltage Vrp.

By setting the threshold voltage Vthp of P channel MOS transistor 2ba to a proper value through, for example, ion implantation into its channel region, back gate voltage VP2 of a desired voltage level can be generated. Further, by using MOS transistors 2bf and 2bh, the back gate voltage of a P channel MOS transistor included in internal circuitry 1 (see FIG. 1) can be switched at high speed at the time of back gate voltage switching.

Figure 7:
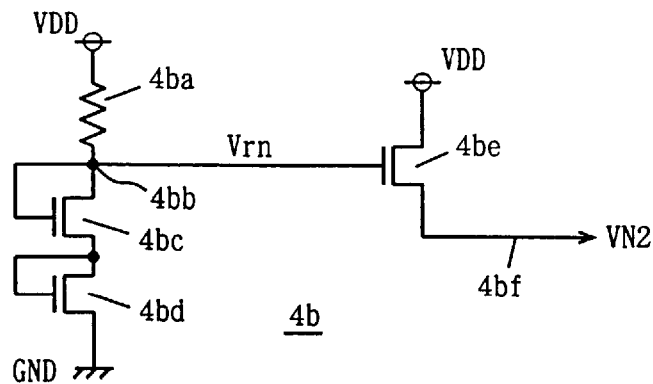
FIG. 7 shows an example of the structure of a voltage generation circuit generating a back gate voltage VN2 shown in FIG. 1.

Although voltage generation circuit 4b which generates voltage VN2 can be realized by the same structure as the one shown in FIG. 6, another structure is shown in FIG. 7.

FIG. 7 shows an example of the structure of voltage generation circuit 4b shown in FIG. 1. In FIG. 7, voltage generation circuit 4b includes a resistive element 4ba of high resistance connected between power supply node VDD and an internal node 4bb, diode-connected N channel MOS transistors 4bc and 4bd connected in series between internal node 4bb and ground node GND, and an N channel MOS transistor 4be connected between power supply node VDD and a node 4bf and having its gate receiving a voltage Vrn from internal node 4bb.

Respective channel resistances of N channel MOS transistors 4bc and 4bd are made sufficiently smaller than the resistance value of high resistance resistive element 4ba. MOS transistors 4bc and 4bd operate in the diode mode and causes a voltage drop of threshold voltage Vthn. Therefore, voltage Vrn from internal node 4bb attains the voltage level of 2·Vthn. Since N channel MOS transistor 4be has its, gate voltage lower than power supply voltage VDD applied to its drain, the transistor operates in a source follower mode and transfers to output node 4bf a voltage which is lower than gate voltage Vrn by threshold voltage Vth. Therefore, voltage VN2 comes to have Vthn. It is assumed here that the threshold voltages of MOS transistors 4bc, 4bd and 4be are all equal to each other.

By setting the threshold voltages of MOS transistors 4bc, 4bd and 4be to a proper value through, for example, ion implantation into channel regions, back gate voltage VN2 of a necessary voltage level can be generated. Particularly, by sufficiently enlarging the current supplying capability (increasing the gate width W) of MOS transistor 4be, the back gate voltage of an N channel MOS transistor included in internal circuitry 1 can be switched at high speed even at the time of back gate voltage switching.

Further, the circuit structure for generating a prescribed voltage level by the source follower mode transistor shown in FIG. 7 can be applied to voltage generation circuit 2b which generates voltage VP2. By exchanging the ground node and the power supply node and changing all N channel MOS transistors to P channel MOS transistors in FIG. 7, voltage VP2 can be generated.

Figure 8:
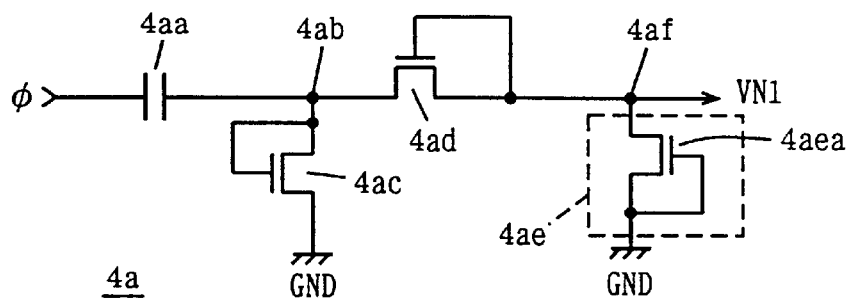
FIG. 8 shows an example of the structure of a voltage generation circuit generating a back gate voltage VN1 shown in FIG. 1.

FIG. 8 shows an example of the structure of voltage generation circuit 4a which generates voltage VN1 shown in FIG. 1. In FIG. 8, voltage generation circuit 4a includes a capacitor 4aa receiving a clock signal φ, an N channel MOS transistor 4ac connected between a node 4ab and ground node GND and having its gate connected to node 4ab, an N channel MOS transistor 4ad connected between node 4ab and an output node 4af and having its gate connected to output node 4af, and a clamping circuit 4ae clamping the voltage level of output node 4af to a prescribed voltage level. In FIG. 8, clamping circuit 4ae is shown including one N channel MOS transistor 4aea connected between output node 4af and ground node GND and having its gate connected to ground node GND.

Clock signal φ changes between the power supply voltage VDD level and the ground voltage GND level. Capacitor 4aa changes the voltage level of node 4ab by a charge pumping operation. MOS transistor 4ac operates in the diode mode and clamps the voltage level of node 4ab to the voltage level of Vthn. Therefore, the voltage of node 4ab changes between Vthn and Vthn−VDD by the charge pumping operation of capacitor 4aa.

When the voltage of output node 4af is higher than the voltage level of node 4ab by at least threshold voltage Vthn, MOS transistor 4ad is rendered conductive to supply an electric charge from output node 4af to node 4ab. Therefore, when the voltage level of node 4ab is lowered to the voltage level of Vth−VDD, MOS transistor 4ad is rendered conductive to lower the voltage level of output node 4af. Finally, output node 4af can reach the voltage level of 2·Vthn−VDD. The voltage level of output node 4af is clamped to the voltage level of −Vthn by clamping circuit 4ae. Therefore, voltage VN1 attains the voltage level of −Vthn. By setting the threshold voltages of MOS transistors 4ac, 4ad and 4aea to proper values, voltages VN1 can be set to a desired negative voltage level.

Figure 9:
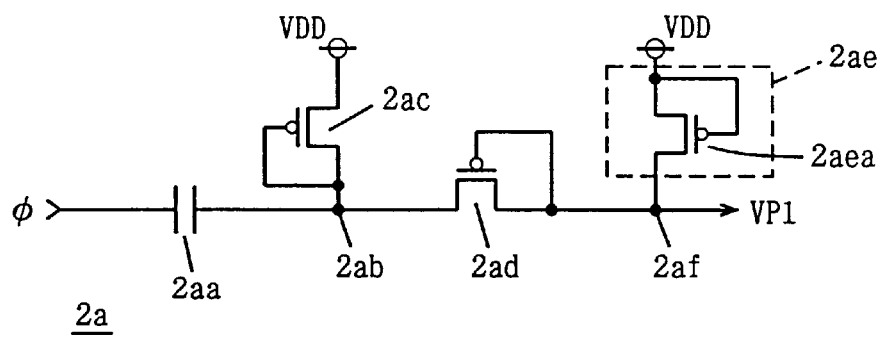
FIG. 9 shows an example of the structure of a voltage generation circuit generating a back gate voltage VP1 shown in FIG. 1.

FIG. 9 shows an example of the structure of voltage generation circuit 2a which generates voltage VP1 shown in FIG. 1. In FIG. 9, voltage generation circuit 2a includes a capacitor 2aa receiving clock signal φ, a P channel MOS transistor 2ac connected between power supply node VDD and an internal node 2ab and having its gate connected to node 2ab, a P channel MOS transistor 2ad connected between node 2ab and an output node 2af and having its gate connected to output node 2af, and a clamping circuit 2ae clamping the voltage level of output node 2af to a prescribed voltage level. In FIG. 9, clamping circuit 2ae is shown to including one P channel MOS transistor 2aea connected between power supply node VDD and output node 2af and having its gate connected to power supply node VDD. Therefore, clamping circuit 2ae clamps output node 2af to the voltage level of VDD+|Vthp| when one P channel MOS transistor 2aea is employed.

Voltage generation circuit 2a shown in FIG. 9 is formed only by changing the conductivity type and connection of MOS transistors of voltage generation circuit 4a shown in FIG. 8. Therefore, in voltage generation circuit 2a shown in FIG. 9, the voltage of internal node 2ab is changed between the voltage levels of |Vthp| and VDD+|Vthp|, and MOS transistor 2ad is rendered conductive to supply an electronic charge to output node 2af when the voltage level of internal node 2ab is higher than the voltage level of output node 2af by at least |2Vthp|.

Voltage generation circuit 2a can transfer the voltage of VDD+2|Vthp| to output node 2af. Clamping circuit 2ae clamps the voltage level of output node 2af to the voltage level of VDD+|Vthp|. Therefore, voltage VP1 attains the voltage level of VDD+|Vthp|. By setting the threshold voltage of P channel MOS transistor 2aea included in clamping circuit 2ae to a proper value, the voltage level of voltage VP1 can be set to a prescribed voltage level.

Figure 10:
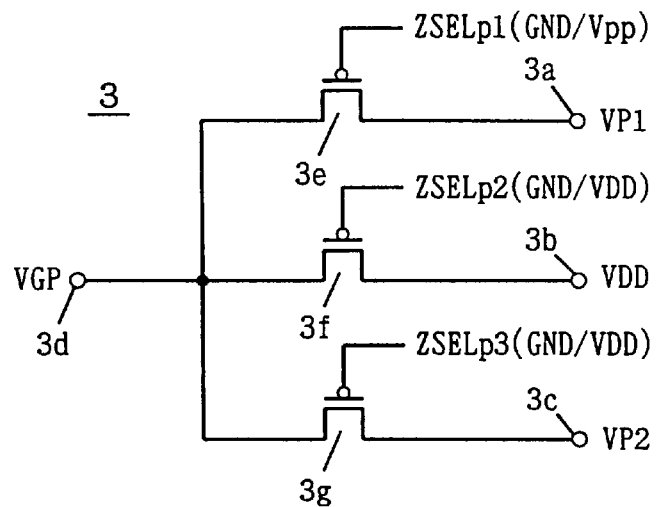
FIG. 10 shows an example of the structure of a selection circuit generating a back gate voltage VGP shown in FIG. 1.

FIG. 10 shows an example of the structure of selection circuit 3 shown in FIG. 1. In FIG. 10, selection circuit 3 includes a transfer gate 3e selectively rendered conductive and transferring voltage VP1 applied to input node 3a to output node 3d in response to a selection signal ZSELp1 from the mode detection circuit, a transfer gate 3f selectively rendered conductive and transferring power supply voltage VDD applied to input node 3b to output node 3d in response to a selection signal ZSELp2 from the mode detection circuit, and a transfer gate 3g selectively rendered conductive and transferring voltage VP2 applied to input node 3c to an output node 3d in response to a selection signal ZSELp3 from the mode detection circuit.

In FIG. 10, each one of transfer gates 3e, 3f and 3g is shown having a P channel MOS transistor, for example. Selection signal ZSELp1 changes between ground voltage GND and a high voltage VPP. High voltage VPP is of at least the voltage level of voltage VP1. Selection signals ZSELp2 and ZSELp3 change between ground voltage GND and power supply potential VDD. These selection signals ZSELp1, ZSELp2 and ZSELp3 attain the ground voltage GND level when activated. A structure that selection signal ZSELp1 attains high voltage VPP when inactivated can easily be realized by a normal level conversion circuit. For example, output voltage VP1 from the voltage generation circuit shown in FIG. 9 can be used as high voltage VPP.

In the structure of selection circuit 3 shown in FIG. 10, only transfer gate provided for an active selection signal is conductive, and the other transfer gates are non-conductive. A voltage designated by selection signals ZSELp1−ZSELp3 is selected and transferred to output node 3d.

Figure 11:
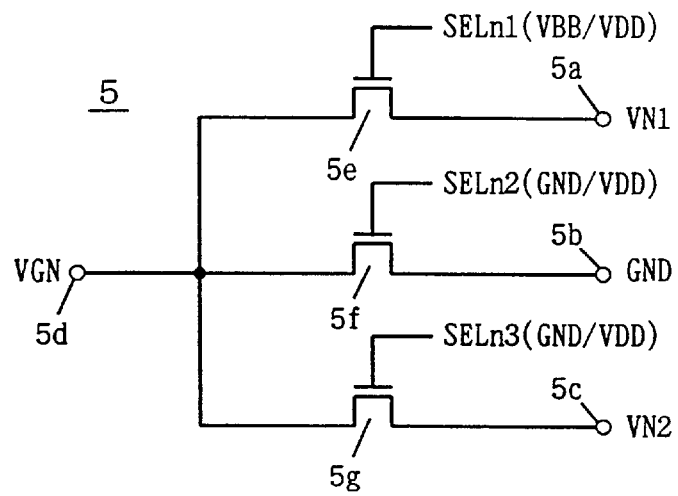
FIG. 11 shows an example of the structure of a selection circuit generating a back gate voltage VGN shown in FIG. 1.

FIG. 11 shows an example of the structure of selection circuit 5 shown in FIG. 1. In FIG. 11, selection circuit 5 includes a transfer gate 5e selecting voltage VN1 applied to input node 5a for transference to output node 5d in response to a selection signal SELn1 from the mode detection circuit, a transfer gate 5f selectively rendered conductive to transfer ground voltage GND supplied to input node 5b to output node 5d in response to a selection signal SELn2 from the mode detection circuit, and a transfer gate 5g selectively rendered conductive to transfer voltage VN2 applied to input node 5c to output node 5d in response to a selection signal SELn3 from the mode detection circuit. In FIG. 11, the transfer gates 5e, 5f and 5g are shown, as an example, being formed by N channel MOS transistors.

Selection signal SELn1 changes between a negative voltage VBB and power supply voltage VDD, while selection signals SELn2 and SELn3 change between the voltage levels of ground voltage GND and power supply voltage VDD. Selection signals SELn1−SELn3 are set to the voltage level of power supply voltage VDD when activated and to the negative voltage or ground voltage level when inactivated. For selection signal SELn1, the voltage level of ground voltage GND is converted to the negative voltage VBB level by a normal level conversion circuit.

In selection circuit 5 shown in FIG. 11 as well, a voltage corresponding to a designated operation mode is selected and output as back gate voltage VNG for an N channel MOS transistor in accordance with selection signals SELn1−SELn3.

Transfer gates 3e−3g and 5e−5g shown in FIGS. 10 and 11 may be formed of CMOS transmission gates.

Figure 12:
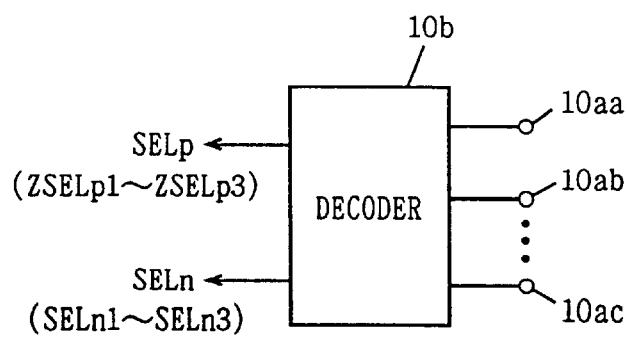
FIG. 12 schematically shows a structure of a mode detection circuit shown in FIG. 1.

FIG. 12 shows an example of the structure of mode detection circuit 10 shown in FIG. 1. In FIG. 12, mode detection circuit 10 includes input nodes 10aa, 10ab, . . .

10ac receiving an operation mode designation signal generated by operation of an operation key, for example, and a decoder 10b for decoding the operation mode designation signals applied to input nodes 10aa–10ac and generating selection signals SELp (ZSELp1–ZSELp3) and SELn (SELn1–SELn3). In the structure of the mode detection circuit shown in FIG. 12, a control signal for designating an operation mode at input nodes 10aa–10ac is applied through operation of the operation key which in turn designates the operation mode of a semiconductor integrated circuit device. Decoder 10b decodes the control signal applied to input nodes 10aa–10ac, and generates selection signals SELp and SELn to select a voltage corresponding to the operation mode designated by the control signal.

Modification of Mode Detection Circuit

Figure 13:
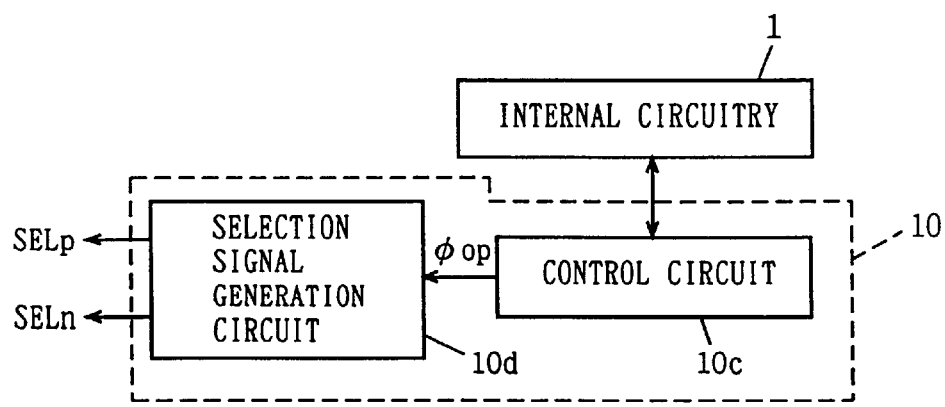
FIG. 13 schematically shows another structure of a mode detection circuit shown in FIG. 1.

FIG. 13 shows a structure of a modification of mode detection circuit 10 shown in FIG. 1. In FIG. 13, mode detection circuit 10 includes a control circuit 10c formed of a processor, for example, for controlling the operation of internal circuitry 1 and monitoring its state, and a selection signal generation circuit 10d for generating selection signals SELp and SELn in accordance with an operation mode designation signal $\phi$OP designating an operation mode of internal circuitry 1 from control circuit 10c.

Control circuit 10c designates the operation mode of internal circuitry 1 in accordance with an externally applied mode designation signal or a mode designation signal generated inside the control circuit by itself according to the processing content. Control circuit 10c also controls the operation of internal circuitry 1, and outputs operation mode designation signal $\phi$OP designating the operation mode of internal circuitry 1. Selection signal generation circuit 10d decodes operation mode designation signal $\phi$OP and selectively drives selection signals SELp and SELn to the active state. Selection signal generation circuit 10d may be so structured that it includes registers provided for respective selection signals SELp1–SELp3 and SELn1–SELn3 shown in FIGS. 10 and 11 for receiving and storing a selection signal or a flag corresponding to an operation mode to be executed in accordance with operation mode designation signal $\phi$OP from control circuit 10c.

Here, voltage generation circuits 2a, 2b, 4a and 4b may be so structured as to stop the voltage generation operation when non-selected, and alternatively these voltages may be applied externally (the voltage generation circuits correspond to voltage pads in this case).

As described above, according to the first embodiment of the present invention, the voltage level applied to the back gate of an MOS transistor is adjusted in accordance with an operation mode, so that the switching speed of the MOS transistor can be adjusted in accordance with the operation speed and the subthreshold leakage current can be adjusted. Therefore, the high speed operation and the low current consumption can be achieved.

Second Embodiment

Figure 14:
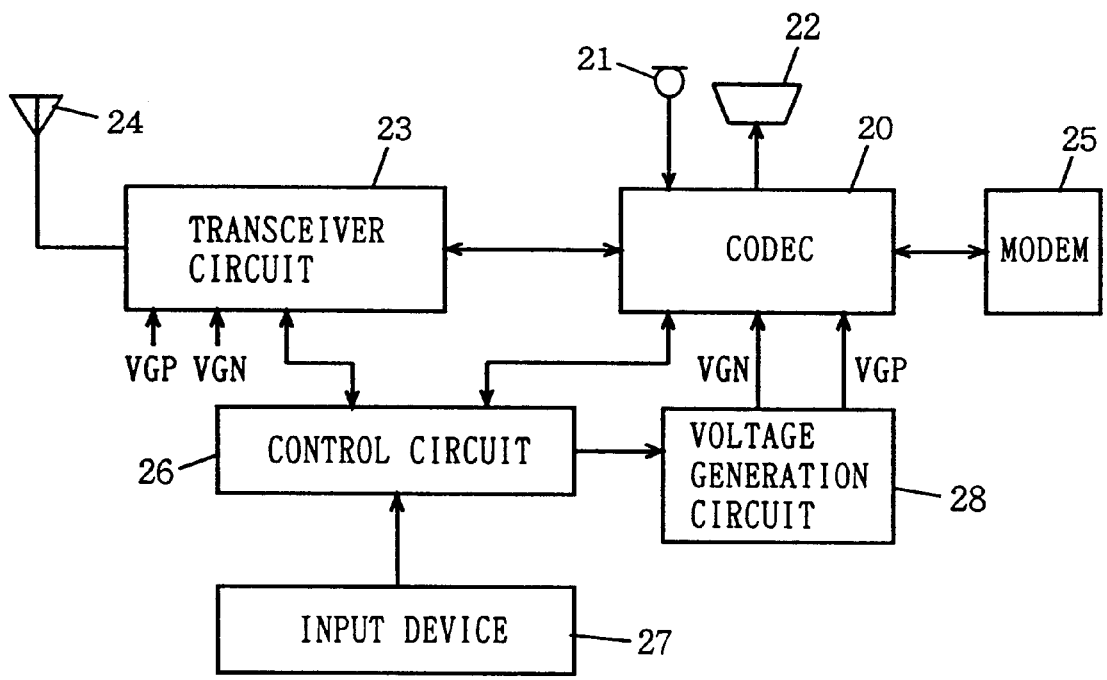
FIG. 14 schematically shows an overall structure of a semiconductor integrated circuit device according to a second embodiment of the present invention.

FIG. 14 schematically shows an overall structure of a semiconductor integrated circuit device according to a second embodiment of the present invention. In FIG. 14, a structure of a portable telephone system is shown as a semiconductor integrated circuit device. In FIG. 14, the semiconductor integrated circuit device includes a codec 20 compressing an audio signal applied through a microphone 21 by ADPCM processing, for example, and expanding a reception signal by an ADPCM decoding processing, for example, to output a reproduced audio signal to a speaker 22, and a transceiver circuit 23 converting the frequency of a transmission signal applied from codec 20 for transmission through antenna 24, and extracting a signal in a prescribed frequency region of a reception signal received through antenna 24 for application it to codec 20.

The semiconductor integrated circuit device further includes a modem 25 modulating and demodulating a data signal of a personal computer, not shown, at the time of data communication to transmit and receive data between codec 20 and the personal computer, a control circuit 26 for controlling the operations of codec 20 and transceiver circuit 23, and controlling the operation modes of codec 20 and transceiver circuit 23 in accordance with the operation mode designation signal applied from an input device 27, and a voltage generation circuit 28 for converting the voltage levels of gate voltages VGN and VGP of MOS transistors included in codec 20. Back gate voltages VGP and VGN from voltage generation circuit 28 are also applied to transceiver circuit 23.

In a digital portable phone system, transceiver circuit 23 performs, for example, time division multiplexing, frequency modulation and demodulation (QPSK modulation and demodulation), superimposition on a carrier, removal of a carrier, and bandpass filtering of transmission and reception signals. As an example, the back gate bias of an MOS transistor included in transceiver circuit 23 is switched as described below. Since these processes are performed at the same speed at the time of signal transmission and reception, the MOS transistor included in transceiver circuit 23 operates in the high speed mode at the time of signal transmission and reception, and the back gate bias is made shallower. On the other hand, in the standby state in which signal reception is not carried out, the back gate bias of the MOS transistor in transceiver circuit 23 is made deeper, and the subthreshold leakage current is reduced. In this case, therefore, the back gate bias of the MOS transistor is switched between two states in transceiver circuit 23.

Since codec 20 can change its processing speed in accordance with the content of a signal to be transmitted and received, back gate voltages VGN and VGP applied at the back gates of the MOS transistor from voltage generation circuit 28 are switched in accordance with each operation mode under the control of control circuit 26.

Figure 15:
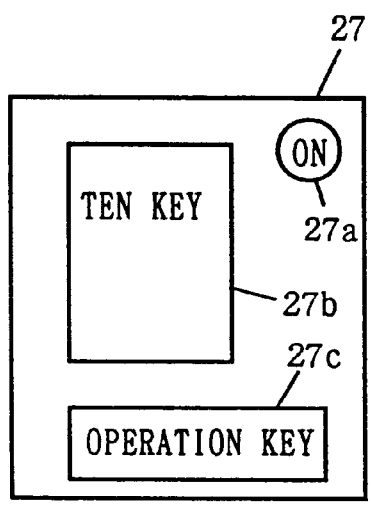
FIG. 15 schematically shows a structure of an input device shown in FIG. 14.
Figure 16:
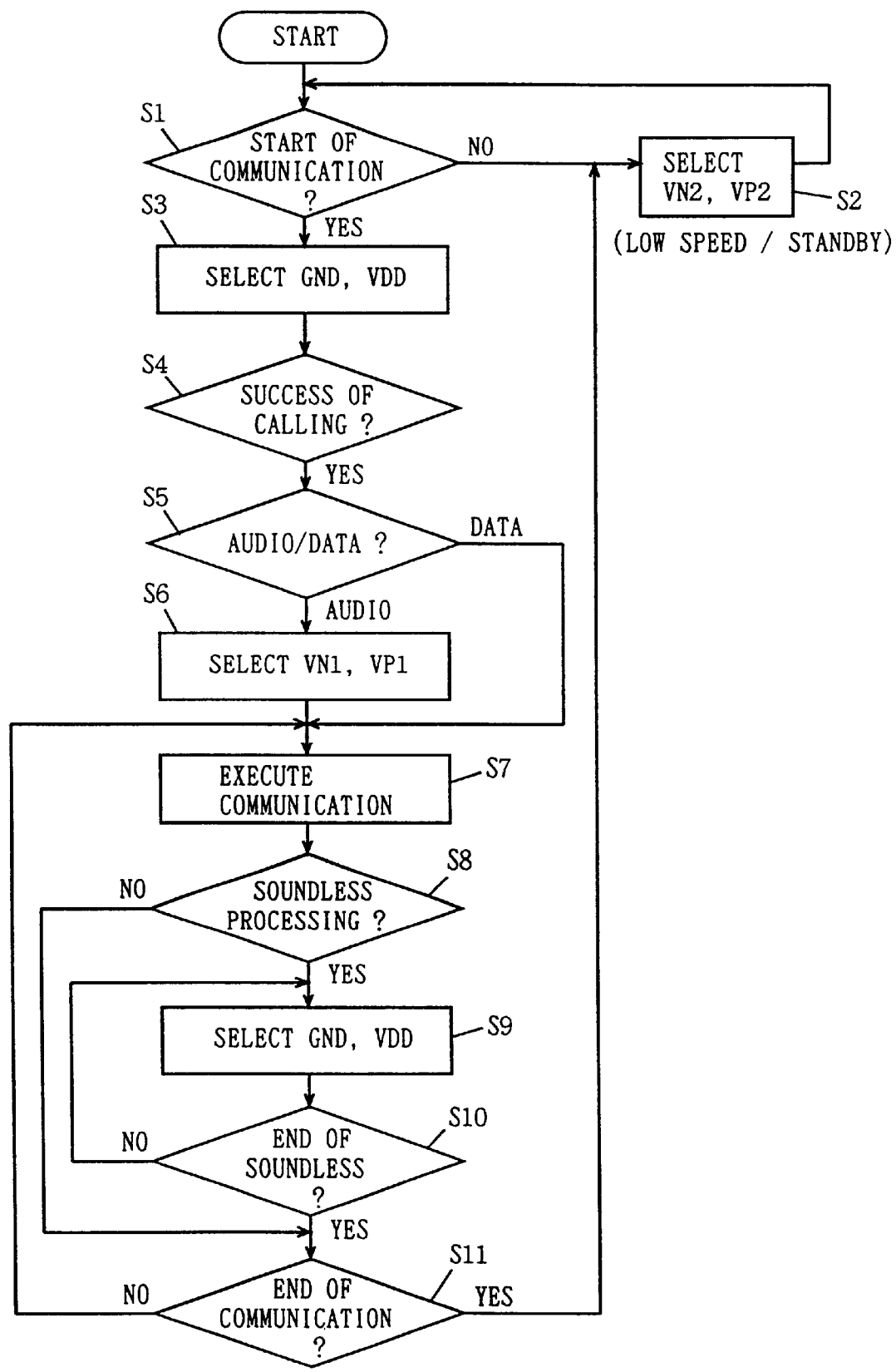
FIG. 16 is a flow chart showing the operation of a semiconductor integrated circuit device shown in FIG. 14.

FIG. 15 shows an example of the structure of an input device 27 shown in FIG. 14. In FIG. 15, input device 27 includes a power supply key 27a for instructing to turn off/on the power supply for the semiconductor integrated circuit device, a ten key 27b for inputting transmission numbers and characters and so on, and an operation key 27c for designating an operation mode such as the start and end of communication. Control circuit 26 detects a designated operation mode from pressing of each key of input device 27, generates a selection signal corresponding to the detected operation mode, and apply it to voltage generation circuit 28. In addition, control circuit 26 determines whether the operation state continues or not in transceiver circuit 23, and in accordance with the result of the determination, adjusts the voltage levels of back gate voltages VGN and VGP generated from voltage generation circuit 28. The operation of the semiconductor integrated circuit device shown in FIG. 14 will be described below which reference to a flow chart shown in FIG. 16.

Control circuit 26 monitors whether an instruction to start communication has been given through operation key 27c of input device 27 (step S1). When the instruction has not been given while power supply key 27a is pressed and power is supplied, control circuit 26 instructs voltage generation circuit 28 to select back gate voltages VN2 and VP2 for a deeper bias (step S2).

When operation key 27c is operated to instruct the start of communication, control circuit 26 instructs voltage generation circuit 28 to select ground voltage GND and power supply voltage VDD corresponding to the medium speed mode (step S3). Codec 20 becomes operable in the medium speed mode. In this state, transceiver circuit 23 is still set to a deeper bias state. The start of communication is also detected by a ring tone signal included in a reception signal.

When there is a call, the semiconductor integrated circuit device operates in the medium speed mode and whether the caller and the callee both enter the response state is detected (step S4). On the transmission side, the success of calling is detected by the existence of the ring tone signal sent back from the callee. On the reception side, the success is detected by pressing of an off-hook key in operation key 27c.

Then, a determination is made whether a signal to be transmitted and received is an audio signal, or a data signal for a personal computer, for example (step S5). Whether the signal is an audio signal or a data signal is detected by the characteristics of, for example, the frequency of the received signal after the start of communication (step S5).

When the communication signal is an audio signal, codec 20 needs to process the signal at high speed. Therefore, control circuit 26 instructs voltage generation circuit 28 to select back gate voltages VN1 and VP1 so as to set the back gate bias to the shallower state. On the other hand, when the communication signal is a data signal, the differential value of data is smaller in compression and expanding processes as compared with audio, and the high speed process is not required. Therefore, the back gate voltages from voltage generation circuit 28 are set to ground voltage GND and power supply voltage VDD corresponding to the medium speed state. Communication is performed in this state (step S7).

At the time of communication, control circuit 26 monitors transceiver circuit 23 and determines whether a soundless state has continued (step S8). If it is determined that the soundless state has continued for a certain period, a signal in the soundless state can be expanded at medium speed in codec 20. Therefore, control circuit 26 instructs voltage generation circuit 28 to select ground voltage GND and VDD to make the back gate bias shallower (step S9). The setting of the back gate voltages to the medium speed mode continues until the soundless state ends.

At step 10, if it is determined that the soundless state has finished, a determination is made whether communication starts. If it is determined that the soundless state does not exist at step S8, step 11 is entered to determine whether communication has ended. On the transmission side, the end of communication is detected by the operation (on-hook key operation) of operation key 27c. If communication is continued, step S7 is entered again. When communication ends, the process goes to step S2 where voltages VN2 and VP2 in a deeper bias state are selected as voltages generated from voltage circuit 28.

Even if the back gate voltages are switched in accordance with the operation mode and the switching of the back gate voltages requires, for example, 10 ms, such time is an extremely short period for a human ear. There is no problem even if a noise is caused at the time of bias switching. During data signal transmission, the mode switching process state does not exist substantially, and even if it does exist, codec 20 operates in the medium speed mode. Therefore, the back gate voltages are not switched and a problem is not caused.

As described above, by switching the voltage levels of the back gate voltages in accordance with the operation mode, the portable phone system according to the second embodiment of the present invention can be operated at optimum speed with optimum current driving capability according to the process. Therefore, a portable phone system can be realized which has improved performance with low current consumption.

Third Embodiment

Figure 17:
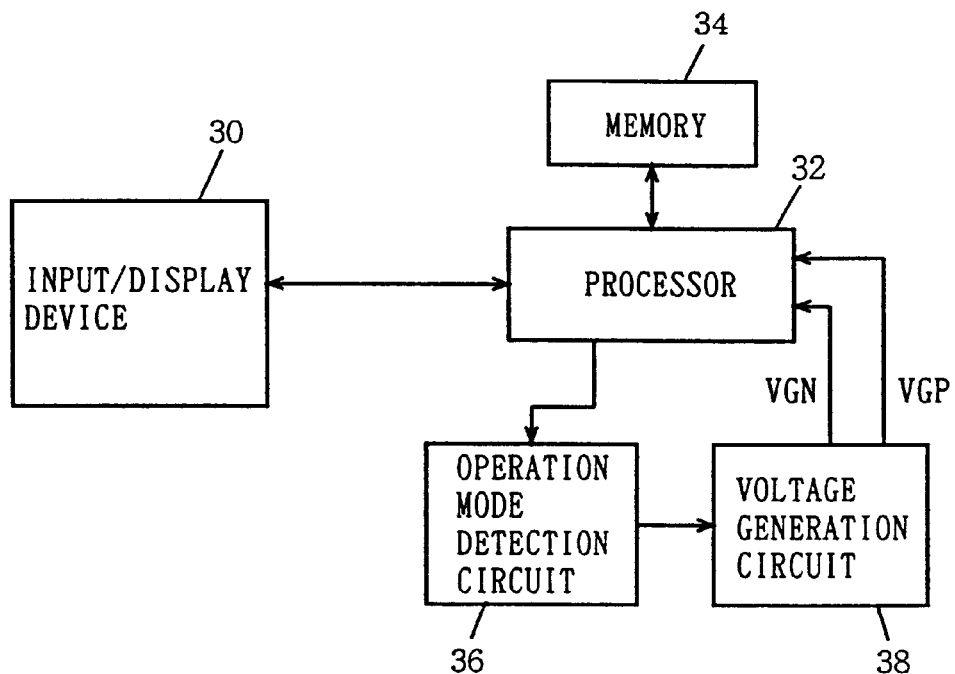
FIG. 17 schematically shows an overall structure of a semiconductor integrated circuit device according to a third embodiment of the present invention.

FIG. 17 schematically shows an overall structure of a semiconductor integrated circuit device according to a third embodiment of the present invention. The semiconductor integrated circuit device shown in FIG. 17 is a portable information terminal equipment such as a PDA (Personal Digital Assistant).

In FIG. 17, the semiconductor integrated circuit device includes an input/display device 30 for inputting an operation instruction, information and so on, and displaying the result of an operated process, a processor 32 carrying out a prescribed process in accordance with a designation signal and data applied through input/display device 30, a memory 34 for providing a work area for storing information to be held at the time of information processing of processor 32, an operation mode detection circuit 36 receiving an internal control signal, for example, of processor 32, detecting the operation mode of processor 32 and generating a selection signal corresponding to the operation mode, and a voltage generation circuit 38 changing the voltage levels of back gate voltages VGN and VGP of an MOS transistor included in processor 32.

Input/display device 30 has a menu display for selecting an operation mode by an icon or the like, an input interface for inputting a hand-written character, and a display screen for displaying the result of an operated process. Processor 32 utilizes memory 34 to carry out its process in accordance with an operation mode instruction and process information supplied from input/display device 30, and displays the process result on the display screen of input/display device 30.

Operation mode detection circuit 36 detects an operation mode to be executed in accordance with the operation mode instruction signal for the operation mode of processor 32. In this case, when processor 32 requests input/display device 30 to input information, operation mode detection circuit 36 detects, by using the request signal, that the processor is in the operation mode for receiving input information. Since processor 32 carries out its process when necessary information is received, processor 32 outputs to display device 30 a signal indicating that processor 32 is carrying out its process. By using this signal, operation mode detection circuit 36 detects that the processor is in a process operation mode.

When processor 32 displays operation result data on input/display device 30, a signal indicating outputting of display information is output from processor 32 to input/display device 30, and is also detected by operation mode detection circuit 36 for detecting a display mode. Voltage generation circuit 38 switches the levels of back gate voltages VGN and VGP to be generated in accordance with selection signals generated according to the operation mode of processor 32.

Figure 18:
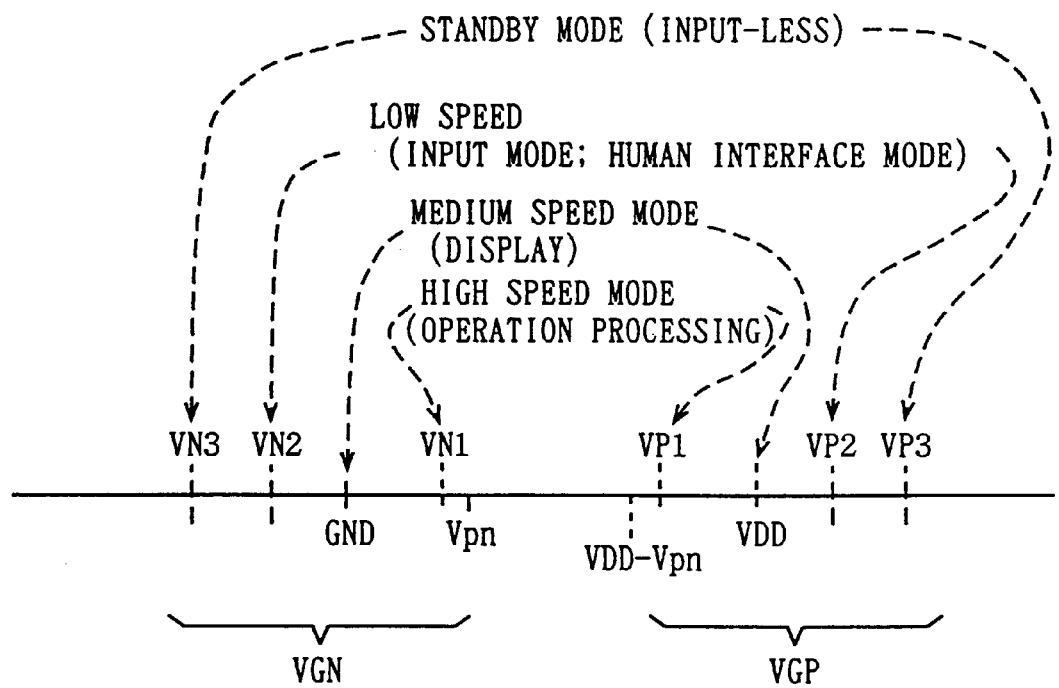
FIG. 18 shows the correspondence between the back gate voltages generated by a voltage generation circuit shown in FIG. 17 and the operation modes.
Figure 19:
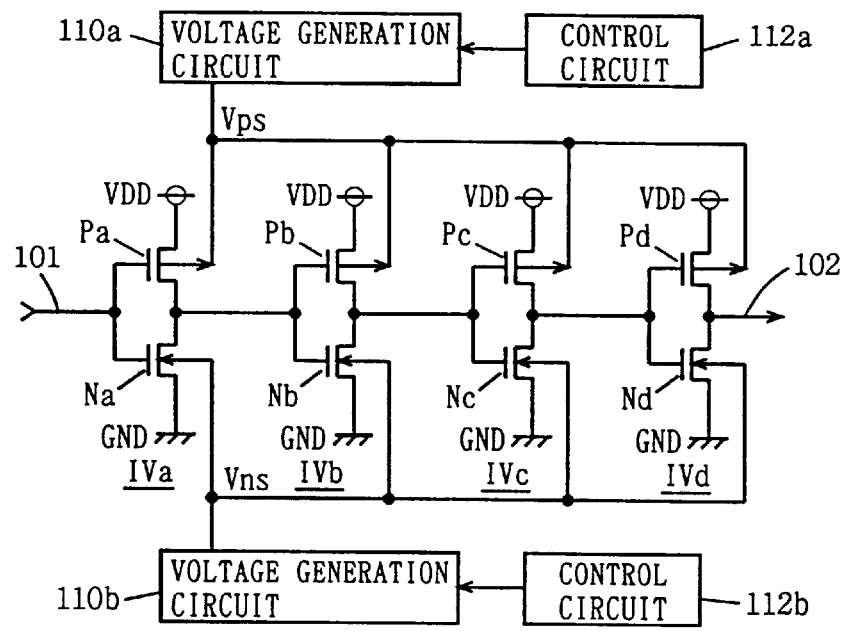
FIG. 19 shows a structure of a conventional semiconductor integrated circuit device.
Figure 20:
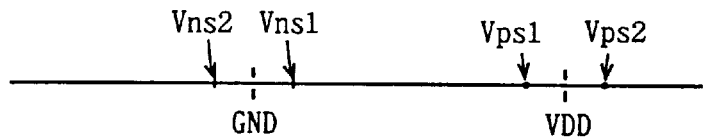
FIG. 20 shows back gate voltage levels shown in FIG. 19.
Figure 21:
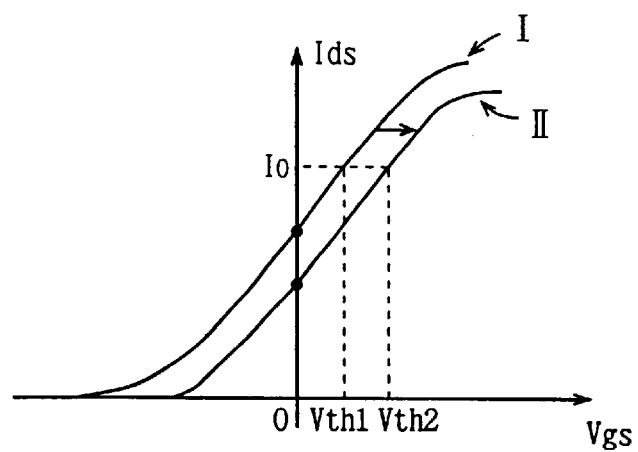
FIG. 21 schematically shows the subthreshold current characteristics of a normal MOS transistor.
Figure 22:
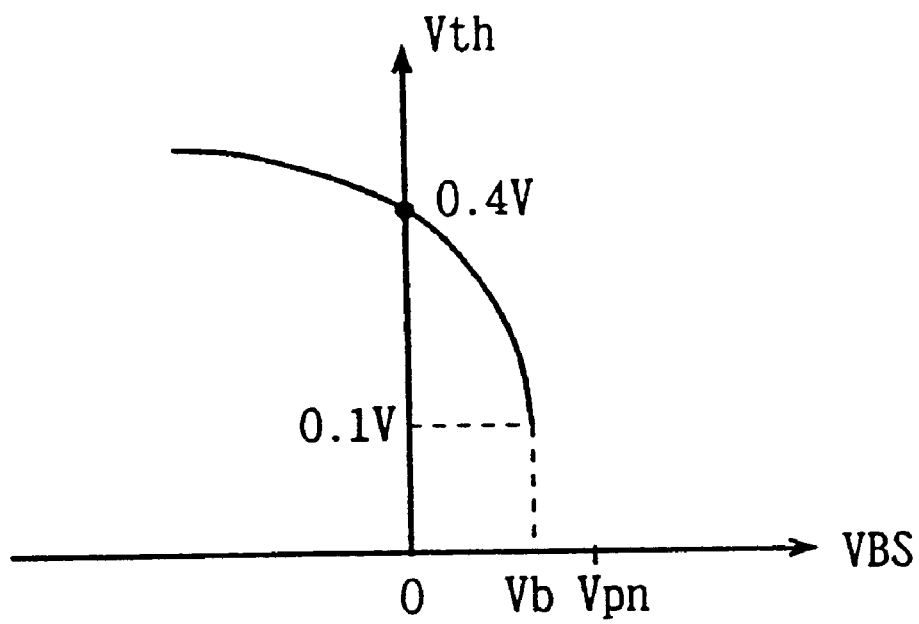
FIG. 22 is a graph for describing problems when the back gate voltages are changed in a conventional MOS transistor.

FIG. 18 shows the voltage levels of back gate voltages VGP and VGN generated by voltage generation circuit 38. As shown in FIG. 18, operation mode detection circuit 36 generates selection signals in accordance with four operation modes. The four operation modes are a mode in which processor 32 carries out its operation (high speed mode), a display mode in which processor 32 displays the result of an operated process on input/display device 30 (medium speed mode), an input mode in which input/display device 30 inputs an operation mode instruction, information to be processed or the like to processor 32 (human interface mode:low speed mode), and an input-free mode in which information is not input at all from input/display device 30 (standby mode). Even if information is not input at all from input/display device 30 for a prescribed period, processor 32 enters the standby mode and therefore a low current consumption mode.

In the operation process mode, voltage generation circuit 38 selects voltages VN1 and VP1 for the shallowest back gate bias for application to the back gate of an MOS transistor in processor 32. In the medium speed mode for displaying, the high speed operability is not required (from the viewpoint of the sensitivity of a human eye). Processor 32 operates in the medium speed mode, and the back gate voltages are set to ground voltage GND and power supply voltage VDD. In the input mode (human interface mode), the operator inputs information through input/display device 30. Since a hand-written character, for example, is input, the high speed processing is not required. Processor 32 only stores in memory 34 information input by an operator through input/display device 30. Thus, the low speed operation is enough for such processing. The back gate bias is made deeper, and voltages VN2 and VP2 are selected and generated from voltage generation circuit 38.

In the standby mode, processor 32 does not carry out any process at all and the MOS transistor is not switched. For low current consumption, the back gate bias is made deepest and voltages VN3 and VP3 are selected. As shown in FIG. 18, by adjusting the back gate voltage levels in accordance with the operation mode, low current consumption can be achieved without affecting performance.

When a data hold mode for holding information in memory 34 of the semiconductor integrated circuit device shown in FIG. 17 is designated, data holding is performed by using a battery as a power supply. In this case, a battery life needs to be made longer by low current consumption. Therefore, the standby mode is set and voltages VN3 and VP3 are selected as the bank gate biases and applied to memory 34 and periphery circuitry. When the data hold mode is not designated, power is entirely turned off and information in a volatile memory such as a RAM (Random Access Memory) of memory 34 is erased. When a non-volatile memory which stores necessary information in a non-volatile manner is used as memory 34, this data hold mode is not necessary.

As described above, according to the third embodiment of the present invention, the voltage level at the back gate of an MOS transistor of processor 32 is adjusted in accordance with the operation process mode, the display mode, the human interface mode and the standby mode. Therefore, unnecessary current consumption due to a subthreshold leakage current can be reduced without affecting performance.

As described above, according to the present invention, in a semiconductor integrated circuit device having a plurality of operation modes, a voltage generation circuit is provided which generates voltages of different polarities from each other with respect to the source voltage of an MOS transistor. Since one of a plurality of voltages is selected in accordance with an operation mode and applied to the back gate of the MOS transistor, unnecessary large voltage will not be applied between the control gate and the back gate of the MOS transistor, the reliability of the MOS transistor will not be deteriorated, and the MOS transistor having a switching speed and a current drive amount which correspond to an operation mode can easily be realized. Since ground voltage GND and power supply voltage VDD are selected as the back gate voltages in accordance with the operation mode, each back gate voltage level can be set based on performance implemented when the source and the back gate have the same voltage. Therefore, the semiconductor integrated circuit device can easily be designed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:
   internal circuitry including, as a component, a first insulated gate type field effect transistor having a source receiving a prescribed voltage and a back gate and a second insulated gate type field effect transistor different in conductivity type from said first insulated gate type field effect transistor and having a source receiving a predetermined voltage and a back gate, and operable in a plurality of operation modes;
   first bias voltage generation circuitry for generating a plurality of bias voltages including voltages different in voltage level and in polarity with respect to said prescribed voltage from each other;
   second bias voltage generation circuitry for generating a plurality of bias voltages including voltages different in voltage level in polarity with respect to said predetermined voltage from each other;
   operation mode detection circuitry for detecting an operation mode of said internal circuitry and generating a selection signal corresponding to the detected operation mode;
   first bias voltage selection circuitry for receiving the selection signal from said operation mode detection circuitry, selecting one of said plurality of bias voltages from said first bias voltage generation circuitry in accordance with the received selection signal, and applying the selected bias voltage to the back gate of said first insulated gate type field effect transistor; and
   second bias voltage selection circuitry for receiving the selection signal from said operation mode detection circuitry, selecting one of said plurality of bias voltages from said second bias voltage generation circuitry in accordance with the received selection signal and applying the selected bias voltage to the back gate of said second insulated gate type field effect transistor.

2. The semiconductor integrated circuit device according to claim 1, wherein said plurality of operation modes include a standby mode, and an active mode for performing a processing,
   said first bias voltage selection circuitry includes
   means for selecting a first bias voltage, from said plurality of bias voltages from said first bias voltage generation circuitry, for setting said first insulated gate type field effect transistor to a first bias state when said detected operation mode indicates said active mode, and selecting a second bias voltage for setting said first insulated gate type field effect transistor to a second bias state deeper than said first bias state when the detected operation mode indicates said standby mode, and said first bias voltage and said second bias voltage have different polarities with respect to said prescribed voltage.

3. The semiconductor integrated circuit device according to claim 1, wherein said plurality of operation modes include a standby mode, an audio communication mode, and a data communication mode, and said plurality of bias voltages generated from said first bias voltage generation circuitry include a first bias voltage, a second bias voltage, and a third bias voltage different in polarity with respect to the source voltage of said first insulated gate type field effect transistor from said first bias voltage, and said first bias voltage selection circuitry includes
means for selecting said first bias voltage for setting said first insulated gate type field effect transistor to a first bias state when the detected operation mode indicates said audio communication mode, selecting said second bias voltage for setting said first insulated gate type field effect transistor to a second bias state deeper than said first bias state when said detected operation mode indicates said data communication mode, and selecting said third bias voltage for setting said first insulated field effect transistor to a third bias state deeper than said second bias state when said detected operation mode indicates said standby mode.

4. The semiconductor integrated circuit device according to claim 1, wherein said plurality of operation modes include an operation process mode in which data is processed, and an interface mode in which a user inputs data, and a display mode in which a result of operation is displayed on a display screen, and said plurality of bias voltages generated from said first bias voltage generation circuitry include a first bias voltage, a second bias voltage and a third bias voltage different in polarity with respect to the prescribed voltage from said first bias voltage, and said first bias voltage selection circuitry includes
means for selecting said first bias voltage for setting said first insulated gate type field effect transistor to a first bias state when said detected operation mode indicates said operation process mode, selecting said second bias voltage for setting said first insulated gate type field effect transistor to a second bias state deeper than said first bias state when said detected operation mode indicates said display mode, and selecting said third bias voltage for setting said first insulated gate type field effect transistor to a third bias voltage for setting said first insulated gate type field effect transistor to a third bias state deeper than said second bias state when said detected operation mode indicates said interface mode.

5. The semiconductor integrated circuit device according to claim 1, wherein said plurality of operation modes include a standby mode, and an active mode for performing a processing, and said second bias voltage selection circuitry includes
means for selecting a first bias voltage, from said plurality of bias voltages from said second bias voltage generation circuitry, for setting said second insulated gate type field effect transistor to a first bias state when said detected operation mode indicates said active mode, and selecting a second bias voltage for setting said second insulated gate type field effect transistor to a second bias state deeper than said first bias state when the detected operation mode indicates said standby mode, and said first bias voltage and said second bias voltage have different polarities with respect to said predetermined voltage.

6. The semiconductor integrated circuit device according to claim 1, wherein said plurality of operation modes include a standby mode, an audio communication mode, and a data communication mode, and said plurality of bias voltages generated from said second bias voltage generation circuitry include a first bias voltage, a second bias voltage, and a third bias voltage different in polarity with respect to the source voltage of said second insulated gate type field effect transistor from said first bias voltage, and said second bias voltage selection circuitry includes
means for selecting said first bias voltage for setting said second insulated gate type field effect transistor to a first bias state when the detected operation mode indicates said audio communication mode selecting said second bias voltage for setting said second insulated gate type field effect transistor to a second bias state deeper than said first bias state when said detected operation mode indicates said data communication mode, and selecting said third bias voltage for setting said second insulated field effect transistor to a third bias state deeper than said second bias state when said detected operation mode indicates said standby mode.

7. The semiconductor integrated circuit device according to claim 1, wherein said plurality of operation modes includes an operation process mode in which data is processed, and an interface mode in which a user inputs data, and a display mode in which a result of operation is displayed on a display screen, and said plurality of bias voltages generated from said second bias voltage generation circuitry include a first bias voltage, a second bias voltage, and a third bias voltage different in polarity with respect to the predetermined voltage from said first bias voltage, and said second bias voltage selection circuitry includes
means for selecting said first bias voltage for setting said second insulated gate type field effect transistor to a first bias state when said detected operation mode indicates said operation process mode, selecting said second bias voltage for setting said second insulated gate type field effect transistor to a second bias state deeper than said first bias state when said detected operation mode indicates said display mode, and selecting said third bias voltage for setting said second insulated gate type field effect transistor to a third bias state deeper than said second bias state when said detected operation mode indicates said interface mode.

* * * * *